Arthur B. Fox
Charles W. Tepper
INVENTORS
BY R. Frank Smith
Robert F. Crocker
ATTORNEYS Arthur B. Fox
Charles W. Tepper
INVENTORS
BY R. Frank Smith
Robert F. Crocker
ATTORNEYS Jan. 8, 1963 A. B. FOX ET AL 3,072,734

CIRCUIT BOARD FOR MOUNTING AND INTERCONNECTING ELECTRICAL COMPONENTS

Filed Aug. 26, 1958 3 Sheets-Sheet 3

Arthur B. Fox
Charles W. Tepper
INVENTORS

BY R. Frank Smith
Robert T. Crocker
ATTORNEYS 3,072,734

CIRCUIT BOARD FOR MOUNTING AND INTERCONNECTING ELECTRICAL COMPONENTS

Arthur B. Fox and Charles W. Tepper, Rochester, N.Y., assignors to Eastman Kodak Company, Rochester, N.Y., a corporation of New Jersey

Filed Aug. 26, 1958, Ser. No. 757,388
10 Claims. (Cl. 174—68.5)

This invention relates to an improved circuit board of general applicability for mounting and electrically interconnecting electrical components such as are commonly employed in electronic apparatus.

In the production of electrical or electronic apparatus it was, for many years, the practice to connect the various electrical components together by point-to-point wiring. This technique required the use of relatively high skilled workers and was quite costly and time consuming.

In more recent years the trend toward automation and mass production has resulted in the development and relatively extensive use of the so-called "printed icrcuit" techniques. While the use of printed circuitry has eliminated many of the problems encountered with point-to-point wiring, it also is open to several objections. Thus, for example, printed circuit conductors are usually extremely thin and are subject to breaking if the printed circuit board is flexed to any appreciable extent. Moreover, even if a relatively minor circuit change is desired, a completely new printed circuit master negative is required, the preparation of which is both time consuming and expensive.

It is an object of this invention to provide a circuit board of substantially universal applicability which retains the advantages of printed circuitry while, at the same time, eliminating the disadvantages thereof. To attain this object a circuit board is provided comprising a sheet of insulating material of any desired size, to one face of which is firmly secured a perforated sheet of conductive material of substantial thickness. This sheet is perforated in a uniform, repetitive pattern, as will be more fully discussed below, so as to provide a plurality of rows of terminal members adapted to receive the usual pigtail leads of electrical components, the terminals being initially connected together by an integral network of conductors. By punching through or otherwise cutting or rupturing this composite circuit board at selected locations, unwanted electrical connections between the various terminals are broken to leave the desired circuit configuration. The entire procedure is readily adapted to automatic production techniques, requires no skilled labor, and is capable of being used with an almost infinite variety of circuit configurations.

Further objects and advantages will become apparent from the following description and claims especially when considered in the light of the accompanying drawings wherein:

Figure 1:
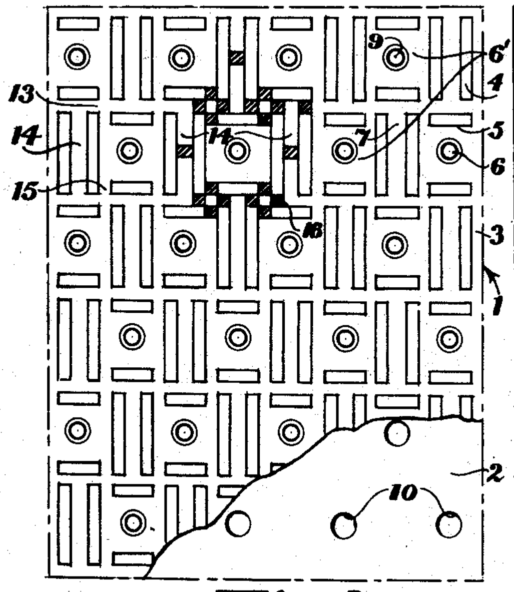
FIG. 1 is a plan view of our improved circuit board.

The presently preferred form of our improved circuit board is indicated generally at 1 in FIG. 1 and comprises a sheet of insulating material 2 to one face of which is rigidly secured a sheet of conducting material 3 such as solder-plated brass which has, prior to assembly, been perforated according to a predetermined repetitive pattern with a plurality of generally rectangular openings 4 and 5 so positioned as to leave a plurality of terminal members 6 located within the interstices of and interconnected by an integral grid or network 7 of conductor elements. The central portion of each terminal is provided with an integral hollow sleeve or eyelet 8 (see FIG. 4) extending beyond the general plane of the sheet 3 and the opening 9 of which is of a diameter adapted to relatively closely receive the usual pigtail leads or other conductors used in electric circuitry. These sleeves 8 each extend through suitable matching openings 10 in the insulator 2 and their protruding outer ends are preferably formed over as shown at 11 in FIG. 5 to secure the sheets together. While this forming or riveting alone may, if desired, be relied upon to secure the sheets together, a stronger assembly will be obtained if a suitable adhesive is applied between the sheets to bond them firmly together.

As best shown in FIG. 1 the terminal members 6 are preferably arranged in a plurality of transverse rows 6' extending across the circuit board, with the terminal members in adjacent rows staggered relative to one another. The terminal members in each row are uniformly spaced from one another and, in the preferred arrangement shown, the distance from a terminal in any row to the two nearest terminals in either adjacent row is the same as that between terminals in the same row. While any desired spacing may be utilized, it has been found that spacings between terminals of approximately one-fifth of an inch are particularly well adapted for use with resistors, capacitors, etc. of the normally used sizes and configurations.

The conductive grid or network comprises elongated conductors 13 extending from side to side across the circuit board intermediate each adjacent pair of rows of terminals. Cross conductors 14 extend between adjacent conductors 13 intermediate each pair of terminals in any given row. Thus, each terminal member is located between a pair of conductors 13 and a pair of conductors 14 which conjointly form a continuous conducting path surrounding the terminal and spaced slightly therefrom. At each corner of the terminal member 6 a short bridging conductor 15 is provided connecting the terminal to the adjacent elongated conductors 13. Thus, it can be readily seen that each of the terminal members 6 is initially connected to every other terminal member by a plurality of conducting paths formed by the conducting network. However, certain of these conducting paths may readily be broken so that any desired terminal member or group of terminal members may be isolated from any other members. Representative points where these conductors may conveniently be broken are shown by the hatching 16 in FIGURE 1.

Figure 2:
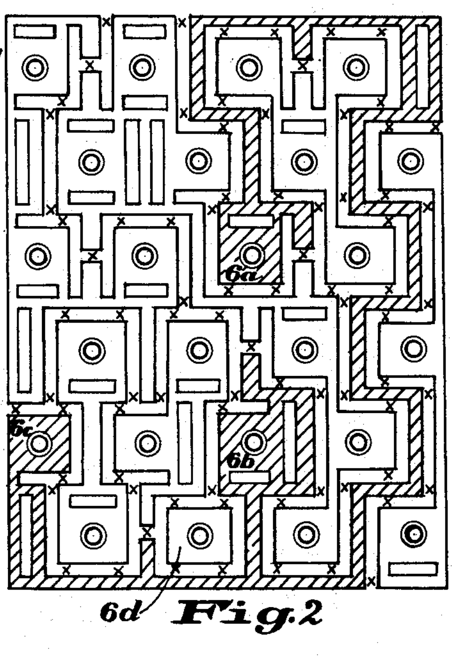
FIG. 2 is a diagrammatic showing of the manner in which the board of FIG. 1 may be used to form a relatively complicated circuit arrangement.

Thus, in FIG. 2 the conducting layer or sheet 3 of a board of the configuration shown in FIG. 1 has had certain of the conductor elements broken away at points indicated by a small "*x*" to provide seven separate circuits, each electrically isolated from the others. For example, one such circuit interconnects terminals *6a*, *6b* and *6c* as indicated by the cross hatching in FIG. 2. The various other circuits can also be readily traced. It is likewise possible to completely isolate any desired terminal from all other terminals as indicated at *6d*. To avoid unnecessary confusion the insulator sheet 2 has not been shown in this FIG. 2. Thus, while in this figure the various circuits are shown entirely separate from one another, it must be remembered that they would actually be supported by the common insulating sheet 2 as clearly shown in FIGS. 5 and 6.

In order to form the circuits such as are represented in FIG. 2 from the circuit board assembly shown in FIG. 1, it is merely necessary to selectively break certain of the conductors by punching slots through the conductor and insulator sheets at the desired points. While this, of course, could be done manually it is preferred that it be done by use of a progressive multiple punching unit which may be selectively controlled to punch out any of the desired slots. An arrangement of punches 17 suitable for use with a circuit board as shown in FIG. 1 is diagrammatically illustrated in FIG. 3. Such an array of punches is capable of punching through and breaking every undesired path formed by the conductors in two full rows in a single operation. Thus, those punches which would be actuated to remove the unwanted conductors to form that portion of the circuitry of FIG. 2 which is comprised by the two top rows of terminals are shown in black in FIG. 3. After this first punching operation, the circuit board would then be advanced two rows and another punching operation used to remove the undesired connections in those particular rows, and so on, until the entire board had been traversed.

Figures 4, 5:
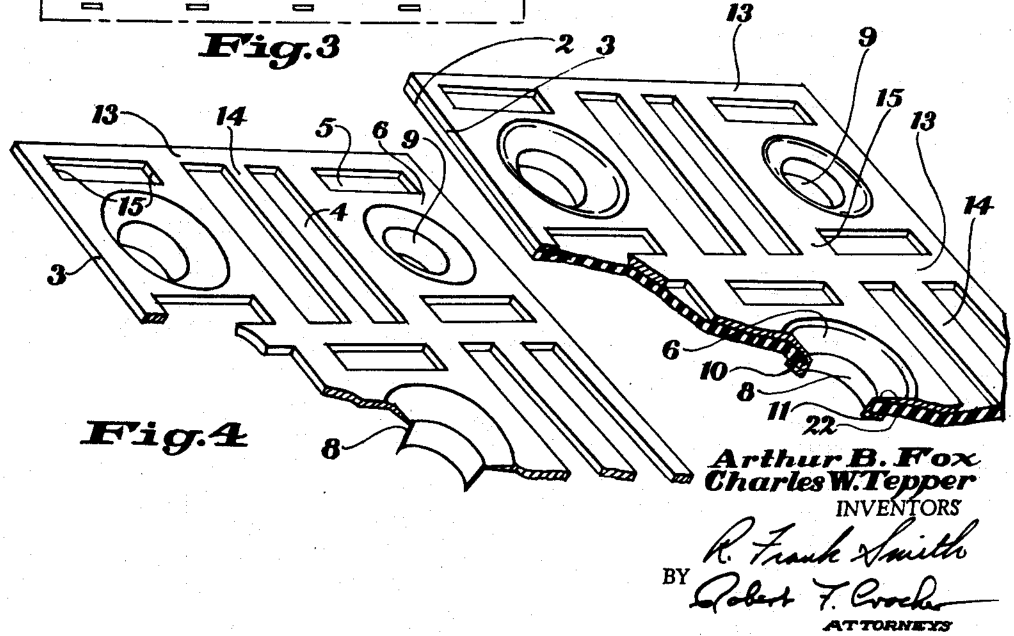
FIG. 4 is a fragmentary perspective view of a portion of the conductor sheet used to make up our improved circuit board.
FIG. 5 is a similar view showing the corresponding portion of the conductor sheet after being secured to the sheet of insulating material.
Figures 6, 7, 8, 9:
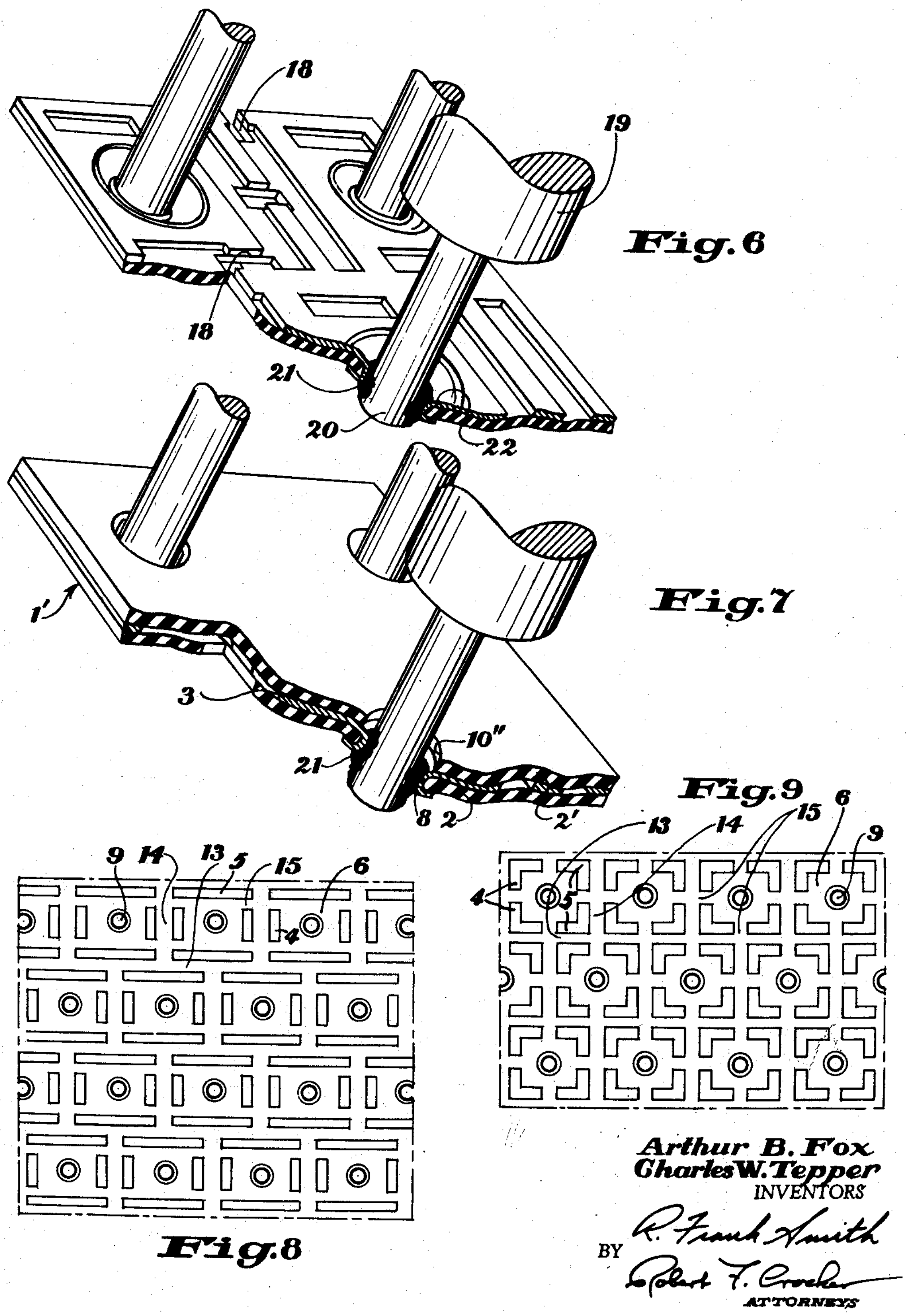
FIG. 6 is similar fragmentary perspective view showing the circuit board after certain undesired conductors have been punched out and with component leads secured to the terminal members.
FIG. 7 is a perspective view of a slightly modified construction of circuit board.
FIGS. 8 through 12 show several alternative patterns of terminal members and conductors which may be utilized in accordance with the teachings of our invention.
Figure 10:
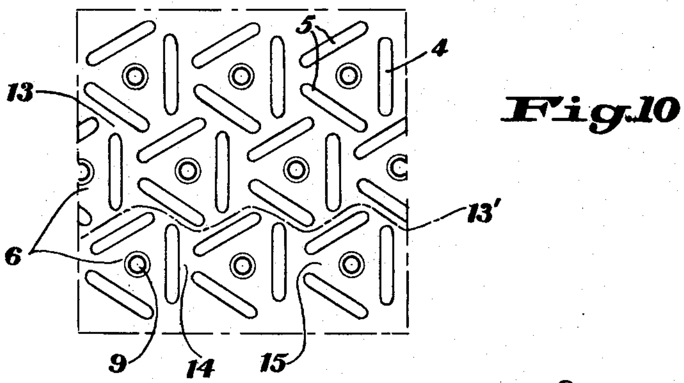
Figure 11:
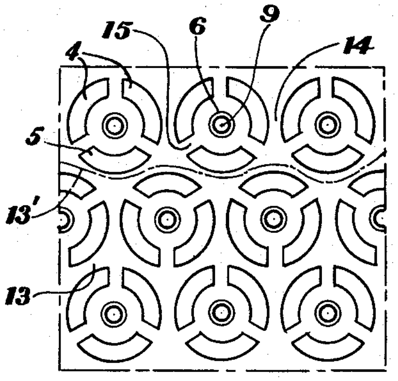

FIG. 4 shows a portion of the terminal and conductor sheet 3 prior to its assembly with the insulating sheet 2 while FIG. 5 shows the assembly of this conducting sheet with the insulating sheet. Note that the upper surface of each terminal member 6 is dished inwardly slightly toward the opening 9 as indicated at 22. This facilitates the insertion of component leads into the eyelets. In FIG. 6 the assembly shown in FIG. 5 is illustrated after the circuit-defining punching operations have been performed. It should be noted that the slots 18 formed during the punching operation extend completely through both the conductor strip network and the insulating sheet and that they correspond to the gaps necessary to form the upper left hand corner of the circuitry shown in FIG. 2. FIG. 6 also shows the manner in which the component leads and wiring are applied to the circuit board after such punching has been completed. It will be noted for example, that a resistor 19 is supported by its pigtail lead 20 which has been inserted into the opening 9 of one of the eyelets 8 and soldered therein, as indicated at 21. In practice, conventional dip soldering techniques, such as are commonly used with printed circuitry, may be utilized, the eyelets 8 in conjunction with the pigtail leads inserted therein tending to cause the solder to flow up into the eyelet by capillary action whereby to produce a highly effective connection, both mechanically and electrically.

Figure 3:
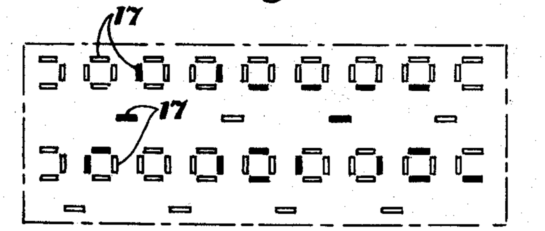
FIG. 3 is a diagrammatic showing of an arrangement of punches suitable for use in conjunction with a circuit board of the type shown in FIG. 1.

It should be noted that the circuit board 1 has been shown in the drawings considerably enlarged to better illustrate the details. Actually FIGS. 1 and 2 represent a board which is only about one square inch in area. This should in no way be considered as limiting since circuit boards can be made of any practical size desired. The conductor sheet 3 may conveniently be manufactured in a continuous strip of any desired width which may thereafter be sheared into sheets of the desired length. Similarly the insulator sheets can be manufactured in corresponding standard widths and lengths. Preferably the punching apparatus will be of sufficient width and will include sufficient punches to permit simultaneous punching at all severance points 16 associated with any row or pair of rows 6' across the entire width of the sheet, as illustrated in FIG. 3, for example.

The arrangement of terminals shown in FIG. 1, for example, is particularly well adapted to the direct mounting of miniature baseless vacuum tubes since it will be noted that the terminals immediately surrounding any given terminal form a regular hexagon any or all of which terminals may conveniently receive and be electrically connected to the tube leads.

While a circuit board as in FIGS. 1, 2 and 4–6 is reasonably strong even after the circuit-defining punching operations have been completed additional strength can readily be obtained when desired by adhesively bonding an additional sheet of insulating material 2' (FIG. 7) to the upper surface of the conductor sheet 3 after the circuit-defining punching operation has been completed but before the components have been inserted. The component leads 20 are then inserted through the perforations 10'' of sheet 2' and into the eyelets 8, to which they are then soldered as previously described and as illustrated in FIG. 7.

As previously stated, a circuit board using the pattern of conductor elements and terminal members shown in FIGS. 1–7 is the presently preferred form of our invention. However, many other patterns can be utilized without departing from the underlying principles of our invention. Several such modifications are illustrated in FIGS. 8–12. Only a small portion of the modified conductor sheet is shown in each of these figures. In practice, of course, these sheets would be secured as in the FIG. 1 embodiment to a matching insulator sheet having a pattern of circular openings 10 therethrough corresponding to the terminal pattern of the particular conductive sheet. In each of these figures the elements have been identified by the same reference numerals as the corresponding elements in the FIG. 1 embodiment.

Thus, the FIG. 8 embodiment is quite similar to that of FIG. 1 except that the four bridging conductors 15 associated with each terminal member 6 connect the terminal to the cross conductors 14 rather than to the elongated conductors 13.

In FIG. 9 there are again four bridging conductors 15 associated with each terminal 6, but in this case two of the bridging conductors connect to the adjacent conductors 13 and two to the conductors 14.

As some slight sacrifice in flexibility of circuit configuration, it is possible to utilize a conductor pattern having less than four bridging conductors per terminal, although there should be at least two for each terminal. Thus, in FIGS. 10 and 11 there are three bridging conductors 15 associated with each terminal 6. It will be noted that in these embodiments the conductor elements 13 are somewhat sinuous in configuration as indicated by the dashed line 13'.

Figure 12:
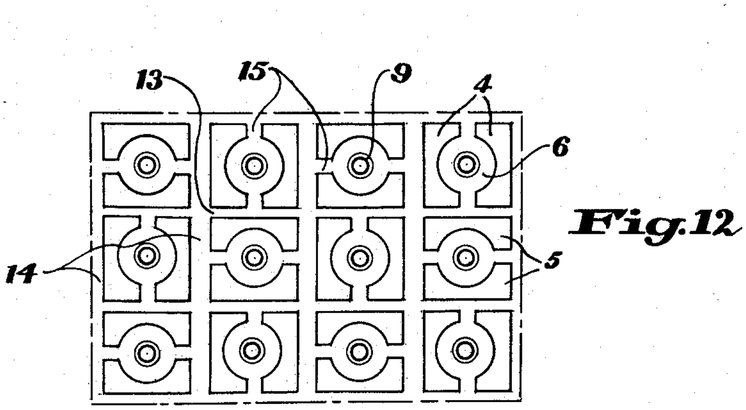

FIG. 12 shows a conductor pattern wherein the terminals 6 in adjacent rows are not staggered as in the other embodiments and wherein but two bridging conductors 15 are associated with each terminal member 6. In this case it will be noted that the bridging conductors associated with adjacent terminal members are differently oriented so that alternate terminals are connected to the conductors 13 and the intervening ones to cross conductors 14.

In all of the embodiments it will be noted that there is a continuous conductive grid with a terminal member 6 located within each of the interstices of the grid and connected by at least two separate bridging conductors to this grid prior to the actual circuit-defining or isolating punching operation. The conductive grid and bridging conductors are so arranged that they may be readily punched out at desired locations without seriously weakening the insulating sheet to which the grid and terminals are secured and, due to the repetitive pattern of terminals and conductors employed, the punching operation is readily adaptable to automatic or semi-automatic control. The eyelets 8 alone are sufficient to hold the conductive sheet 3, including the conductors 13, 14 and 15 and terminals 6, in position on the insulating sheet 2 although, as previously mentioned, it is preferred that this perforated conductive sheet 3 also be adhesively bonded to the insulating sheet during assembly of the circuit board. The eyelets 8, since they protrude slightly beyond the lower surface of the insulator sheet 2, provide well-defined soldering points to which solder is readily attracted during the conventional dip soldering operation. Moreover, solder tends to flow by capillary action up through the eyelets 8 alongside the leads inserted therein whereby to provide a mechanically strong and electrically sound connection between the leads and the associated terminals.

By merely altering the punching program an almost endless variety of circuit configurations can be readily produced using the same basic circuit board. In setting up for a new circuit a board of exactly the same type as will be used in quantity production will be used. Once the desired punching program is worked out for this prototype, the same punching program is immediately available for production and each production board will be an exact replica of the prototype board.

Obviously many variations and modifications may be made without departing from the spirit and scope of the invention as defined by the appended claims.

We claim:

1. A circuit element for mounting and electrically interconnecting electrical components having leads extending therefrom, comprising a unitary sheet of conductive material, said sheet being perforated in a symmetrical repetitive pattern to form a plurality of uniformly spaced parallel rows of terminal members each terminal member being provided with a hole therethrough adapted to receive a component lead, the terminal members in each row being uniformly spaced from one another and the spacing from any selected terminal in any of said rows to the closest adjacent terminal in an adjoining row being equal to that between adjacent terminals in the same row, said perforated sheet further forming a continuous conductive grid including conductor strips completely surrounding but spaced from each of said terminal members, portions of said strips being interposed directly between each adjacent pair of terminal members, and at least two bridging conductors connecting each of said terminal members at spaced points to adjacent portions of said grid conductor strips.

2. A circuit element as in claim 1 wherein the conductor strips of said conductive grid include an elongated conductor strip located between each adjacent pair of rows of terminal members and substantially coextensive therewith, and a transverse conductor strip interconnecting said elongated conductor strips between each adjacent pair of terminal members.

3. A circuit element as in claim 2 wherein there are two of said bridging conductors connecting each of said terminal members to each of the adjacent elongated conductor strips.

4. A circuit element as in claim 1 wherein the terminal members in adjacent rows are relatively staggered in the direction of said rows, the spacing between a terminal member in one row and each of the two nearest terminal members in an adjacent row being equal.

5. A universal circuit board for mounting and electrically interconnecting electrical components having leads extending therefrom comprising a sheet of insulating material and a sheet of conductive material secured together in face-to-face relationship, said conducting sheet being perforated in a symmetrical, repetitive pattern to provide a plurality of uniformly spaced parallel rows of terminal members and a continuous conductive grid interconnecting said terminal members, the terminal members in each row being uniformly spaced from one another and the spacing from any selected terminal in any of said rows to the closest adjacent terminal in an adjoining row being equal to that between adjacent terminals in the same row, said grid including conductor strips completely surrounding but spaced from each of said terminal members, portions of said strips being interposed directly between each adjacent pair of terminal members, and at least two bridging conductors connecting each of said terminal members at spaced points to adjacent portions of said conductor strips, said insulator sheet being provided with a hole therethrough opposite each terminal member and each terminal member being formed to provide an integral hollow eyelet of conducting material adapted to receive a component lead, said eyelets extending through the corresponding holes in said insulator and protruding slightly beyond the outer face thereof.

6. A universal circuit board as set forth in claim 5 wherein the protruding ends of said eyelets are formed over into engagement with the outer face of said insulating sheet to secure said sheets together.

7. A universal circuit board as set forth in claim 5 wherein the outer surfaces of said terminal members surrounding said eyelets are dished inwardly toward said eyelets.

8. A universal circuit element for mounting and electrically interconnecting electrical components having leads extending therefrom, comprising a first plurality of uniformly spaced conductor strips extending generally parallel to one another, and a second plurality of uniformly spaced conductor strips integral with and extending transversely of the first-mentioned strips to conjointly form therewith a continuous conductive grid, a terminal element located in each of the interstices of said grid and spaced from the strips forming said grid, each of said terminal elements being provided with an opening therethrough adapted to receive a component lead, and at least two bridging conductors connecting each terminal element at spaced points to the strips of said grid.

9. A universal circuit element for mounting and electrically interconnecting electrical components having leads extending therefrom, comprising a first plurality of uniformly spaced conductor strips extending generally parallel to one another, and a second plurality of uniformly spaced conductor strips integral with and extending transversely of the first mentioned strips to conjointly form therewith a continuous conductive grid, a terminal element located in each of the interstices of said grid and spaced from the strips forming said grid, each of said terminal elements being provided with an opening therethrough adapted to receive a component lead, and at least two bridging conductors connecting each terminal element at spaced points to the strips of said grid, an insulating sheet arranged in face-to-face contact with said grid, and means securing each of said terminal elements to the adjacent portion of said sheet.

10. A universal circuit element as in claim 9, wherein said securing means includes a sleeve integral with each terminal member, extending through said insulating sheet and having its end portion formed over against the outer face of said sheet, the opening in said sleeve forming the lead-receiving opening of the associated terminal element.

References Cited in the file of this patent

UNITED STATES PATENTS

| | | |
|---|---|---|
| 2,433,384 | McLarn | Dec. 30, 1947 |
| 2,512,820 | Bader | June 27, 1950 |
| 2,559,651 | McLarn | July 10, 1951 |
| 2,613,252 | Heibel | Oct. 7, 1952 |
| 2,630,935 | Gookin | Mar. 10, 1953 |
| 2,872,565 | Brooks | Feb. 3, 1959 |
| 2,932,772 | Bowman et al. | Apr. 12, 1960 |

OTHER REFERENCES

MacDonald: "Electronics," June 1947, pages 82–85.